United States Patent
Grewing et al.

(10) Patent No.: US 8,222,961 B2
(45) Date of Patent: Jul. 17, 2012

(54) TIME-DOMAIN MEASUREMENT OF PLL BANDWIDTH

(75) Inventors: Christian Grewing, Stockholm (SE);
Anders Jakobsson, Stockholm (SE);
Ola Pettersson, Stockholm (SE);
Anders Emericks, Stockholm (SE);
Bingxin Li, Stockholm (SE)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 13/016,089

(22) Filed: Jan. 28, 2011

(65) Prior Publication Data

US 2011/0187424 A1   Aug. 4, 2011

(51) Int. Cl.
*H03L 7/00* (2006.01)

(52) U.S. Cl. ............. 331/16; 331/1 A; 331/34; 375/375; 375/374; 375/376; 327/156; 327/159

(58) Field of Classification Search .................... 331/16, 331/34, 1 A; 327/156, 159; 375/375, 376, 375/374
See application file for complete search history.

(56) References Cited

U.S. PATENT DOCUMENTS

| | | | |
|---|---|---|---|
| 5,663,688 A * | 9/1997 | Delmas et al. | 331/14 |
| 6,873,670 B1 * | 3/2005 | Chiu | 375/375 |

* cited by examiner

*Primary Examiner* — Arnold Kinkead
(74) *Attorney, Agent, or Firm* — Finnegan, Henderson, Farabow, Garrett & Dunner LLP

(57) ABSTRACT

A method and a device for determining closed loop bandwidth characteristic of a Phase Locked Loop (PLL) (52) comprising a voltage controlled oscillator (VCO) (53) controlled by means of a tuning voltage ($V_{tune}$) is disclosed. An embodiment of the invention compares the VCO tuning voltage ($V_{tune}$) to a low threshold voltage ($V_{low}$) and a high threshold voltage ($V_{high}$), creating an oscillation of the VCO tuning voltage by offsetting the divider value such that the PLL (52) forces the tuning voltage ($V_{tune}$) towards the high threshold voltage ($V_{high}$) when the low threshold voltage ($V_{low}$) is reached, and offsetting the divider value such that said PLL (52) forces the tuning voltage ($V_{tune}$) towards the low threshold voltage ($V_{low}$) when the high threshold voltage ($V_{high}$) is reached, measuring the period of the oscillation between the high and the low threshold voltage of the VCO tuning voltage by counting the number of cycles of a reference clock signal (clk), and comparing the number of reference clock cycles to a reference number of clock cycles to determine the relative loop bandwidth of the PLL (52).

14 Claims, 3 Drawing Sheets

TIME-DOMAIN MEASUREMENT OF PLL BANDWIDTH

CROSS-REFERENCE TO RELATED APPLICATION

This application claims priority to Sweden Patent Application No. SE1000087-5, filed on Jan. 29, 2010, which is hereby incorporated by reference in its entirety.

FIELD OF THE INVENTION

The present invention relates to a method and device for measuring closed loop bandwidth characteristic of a Phase Locked Loop (PLL) comprising a voltage controlled oscillator (VCO) controlled by means of a tuning voltage.

BACKGROUND OF THE INVENTION

Phase modulation of a carrier is commonly performed by means of modulating a Phase Locked loop (PLL) generating the carrier using, e.g., a polar modulation architecture. In order to minimize noise from a Phase Locked Loop (PLL), its bandwidth is often relatively small compared to the modulation bandwidth of modern wireless communication protocols like WCDMA and EDGE, and the modulation bandwidth might be only about one fifth of the bandwidth needed for phase modulation. As a consequence, when directly modulating the PLL, it may effectively provide low pass filtering of the phase modulation signal, reducing modulation accuracy.

To compensate for this deficiency, the modulation signal can be pre-compensated by accentuating higher frequencies. In order to do so, one or more frequency characteristics, such as the −3 dB bandwidth, of the PLL must be known. Variations in process parameters, temperature and device matching will cause this bandwidth to differ over temperature and between different samples of the circuit.

Current techniques for measuring the characteristics of the PLL inject a step or impulse and measures how the loop behaves. From this, the bandwidth can be established.

The internal components of a PLL and the functions of a PLL are known as such and will not be discussed in detail in this application. However, it may be mentioned explicitly that feeding back an output signal of a VCO into the loop of a PLL, and this signal being fed back through a divider, through which the fed back VCO signal is divided with a divider value N, thereby feeding back a fraction of the VCO output signal value into the loop may also be known as such.

SUMMARY OF THE INVENTION

It is a problem to modulate a PLL directly because of the relatively low loop bandwidth which reduces the modulation accuracy and limits the highest implementable modulation bandwidth.

It is also a problem to match pre-distortion to varying PLL bandwidth characteristics unless the variations are monitored and/or characterized.

Consequently, a method for measuring bandwidth characteristic is needed to facilitate compensation. A downside of prior art measuring techniques is that these techniques require exact measurement of a voltage, or does not fully or accurately characterize the PLL under closed-loop conditions.

It is noted that it is also a problem to cost and energy efficiently, measure the bandwidth characteristics of a PLL in integrated circuits using techniques that rely on precise voltage measurements.

With the purpose of solving one or more of the above indicated problems, and from the standpoint of the above indicated field of technology, a method according to the present invention teaches that the VCO tuning voltage should be compared to a low threshold voltage and a high threshold voltage. It is taught that an oscillation of the VCO tuning voltage is creating by offsetting the divider value such that the PLL forces the tuning voltage towards the high threshold voltage when the low threshold voltage is reached, and offsetting the divider value such that the PLL forces the tuning voltage towards the low threshold voltage when the high threshold voltage is reached.

When this oscillation has been created, it is taught that the period of the oscillation between the high and the low threshold voltage of the VCO tuning voltage is measured by counting the number of cycles of a reference clock signal, and that the relative loop bandwidth of the PLL is determined by comparing the number of reference clock cycles to a predetermined reference number of clock cycles.

There are different ways of generating such oscillation. One example embodiment compares the tuning voltage with a high threshold voltage in a first comparator, compares the tuning voltage with a low threshold voltage in a second comparator, feeds the output of the first and second comparators to a Set/Reset flip-flop (SRFF), and toggles the output of the SRFF when either of the high and low threshold voltages is reached, thus generating an output oscillating signal corresponding to the oscillation of the VCO tuning voltage from the output of the SRFF.

Another example embodiment teaches that the oscillation is generated by comparing the tuning voltage with a predefined threshold voltage in a comparator with hysteresis, where the hysteresis is chosen such that the low-to-high and high-to-low threshold voltages equal the high and low threshold voltages, thus generating an output oscillating signal corresponding to the oscillation of the VCO tuning voltage from the output of the comparator with hysteresis.

Regardless of how the oscillation is generated, the output oscillating signal is preferably used as input of a look-up table (LUT), and the divider offset value generated from the LUT. Also preferably, the input of the LUT is a one-bit input.

In a preferred mode, the counting of cycles of the reference clock signal during the oscillation period is accomplished by counting the reference clock cycles with a pulse counter, and storing the output of the pulse counter and at the same time resetting the pulse counter after each full oscillation cycle of the tuning voltage.

With the purpose of providing a possibility to measure the true characteristics of components in the PLL without exceeding the working range of the PLL, the high and low threshold voltages are preferably chosen so that the amplitude of the tuning voltage oscillation is as high as possible within the linear working range of the PLL.

With the purpose of providing a statistically accurate value of the closed loop bandwidth, the reference clock cycles are preferably counted over multiple of VCO tuning voltage oscillation cycles, and the number of reference clock cycles averaged over the number of multiple oscillation cycles.

The present invention is particularly advantageous when used in connection with a PLL using a polar modulation architecture In an example embodiment of the invention, it is implemented through a device for measuring the closed loop bandwidth characteristics of a Phase Locked Loop (PLL), where the PLL comprises a voltage controlled oscillator (VCO) controlled by means of a tuning voltage. An example such inventive device comprises a comparing unit adapted to compare the VCO tuning voltage based upon a first and a second threshold voltage, e.g. by comparing to one low and one high threshold voltage. The example device comprises a generating unit adapted to generate a constant that is preferably added to a divider command word of the PLL when the low threshold voltage is reached, thus offsetting the divider value such that the PLL forces the tuning voltage towards the high threshold voltage; and to generate a constant that is subtracted from the divider command word of the PLL when the high threshold voltage is reached, thus offsetting the divider value such that the PLL forces the tuning voltage towards the low threshold voltage. The example device is thus adapted to generate an oscillation of the VCO tuning voltage. It is also disclosed a device comprising a measuring unit, which is adapted to measure the period of the oscillation between the high and the low threshold voltage of the VCO tuning voltage by counting the number of cycles of a reference clock signal; and a device comprising a determining unit, which is adapted to compare the number of reference clock cycles to a predetermined reference number of clock cycles thereby determining the relative loop bandwidth of the PLL.

A comparing unit may be implemented in various ways. One embodied example comparing unit comprises a first comparator, adapted to compare the tuning voltage with the high threshold voltage, and a second comparator, adapted to compare the tuning voltage with the low threshold voltage. A comparing unit according to this embodiment preferably also comprises a Set/Reset flip-flop (SRFF), adapted to receive the output of the first and second comparator, and the output of the SRFF being adapted to be toggled when either of the high or low threshold voltage is reached. The comparing unit according to this embodiment is thus adapted to generate an output oscillating signal corresponding to the oscillation of the VCO tuning voltage from the output of the SRFF.

Another embodied example comparing unit comprises a comparator with hysteresis adapted to compare the tuning voltage with a predefined threshold voltage, where the hysteresis is chosen such that the low-to-high and high-to-low threshold voltages equal the high and low threshold voltages. A comparing unit according to this embodiment is thus adapted to generate an output oscillating signal corresponding to the oscillation of the VCO tuning voltage from the output of the comparator with hysteresis.

Regardless of how the comparing unit is implemented, preferably the generating unit comprises a look-up table (LUT), that the comparing unit is adapted to drive the LUT by means of the output oscillating signal, and that the generating unit is adapted to generate the constant through the LUT.

A measuring unit comprising a pulse counter adapted to count the reference clock cycles is also disclosed. The measuring unit is preferably adapted to store the output of the pulse counter and at the same time reset the pulse counter after each full oscillation cycle of the tuning voltage.

According to an aspect of the invention, the high and low threshold voltages are chosen so that the amplitude of the tuning voltage oscillation is as high as possible within the linear working range of the PLL.

The measuring unit is preferably adapted to count the number of reference clock cycles over multiple of VCO tuning voltage oscillation cycles, and average the number of reference clock cycles over the VCO tuning voltage oscillation cycles.

According to preferred embodiments, the invention is implemented in a PLL having a polar modulation architecture.

According to an aspect of the invention, the device is an on chip device, not excluding it being an on chip device together with the PLL.

An example advantage of a method and device according to the present invention is the possibility to measure and determine the loop bandwidth by measuring a time difference, which is easier and which provides a greater accuracy, than measuring a voltage level. In particular, the invention is advantageous when implemented in an integrated circuit where it is a problem to rely on precise voltage measurements, but where the inventive time measurement can be easily performed.

Example embodiments of the invention facilitate measuring the loop bandwidth characterizing the PLL under closed-loop conditions.

Also an example advantage is measurements being made cost and energy efficiently due to measurements being made by on-chip devices and/or in a digital realm instead of traditional analogue realm of voltage measurements.

BRIEF DESCRIPTION OF THE DRAWINGS

A method and a device according to the present invention will now be described in detail with reference to the accompanying drawings, in which.

DETAILED DESCRIPTION OF THE EMBODIMENTS

Figure 1:
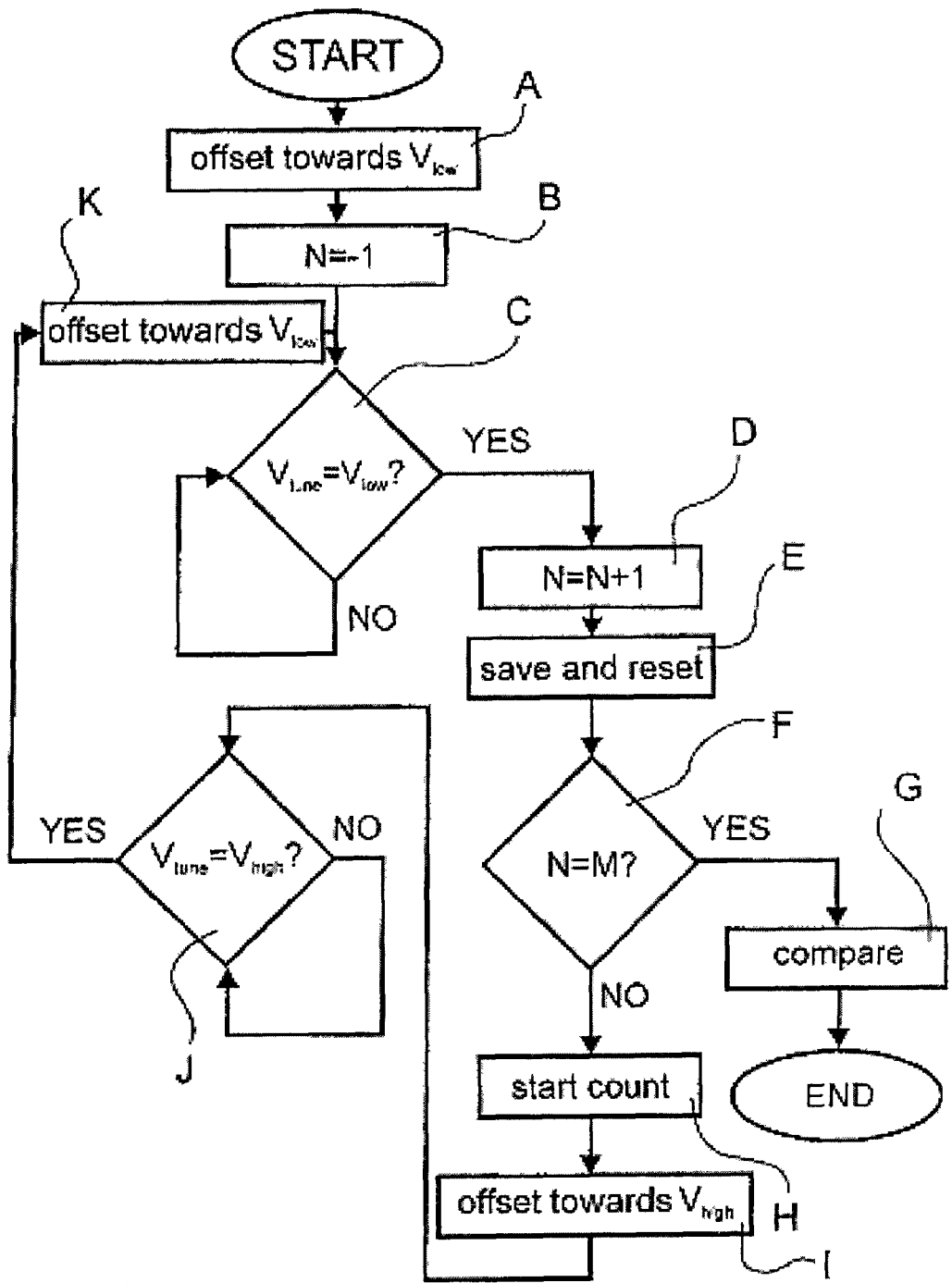
FIG. 1 is a flowchart illustrating the principle of the inventive method.

The present invention will now be described with reference to FIG. 1 illustrating a method for measuring the closed loop bandwidth characteristics of a Phase Locked Loop (PLL) comprising a voltage controlled oscillator (VCO) controlled by means of a tuning voltage.

The inventive method comprises the steps of:

comparing the VCO tuning voltage to a low threshold voltage "C" and a high threshold voltage "J", creating an oscillation of the VCO tuning voltage by offsetting the divider value such that the PLL forces the tuning voltage towards the high threshold voltage "I" when the low threshold voltage is reached "C", and offsetting the divider value such that the PLL forces the tuning voltage towards the low threshold "K" voltage when the high threshold voltage is reached "J", measuring the period of the oscillation between the high and the low threshold voltage of the VCO tuning voltage by counting the number of cycles of a reference clock signal "H", and comparing "G" the number of reference clock cycles to a predetermined reference number of clock cycles to determine the relative loop bandwidth of the PLL.

Figure 2:
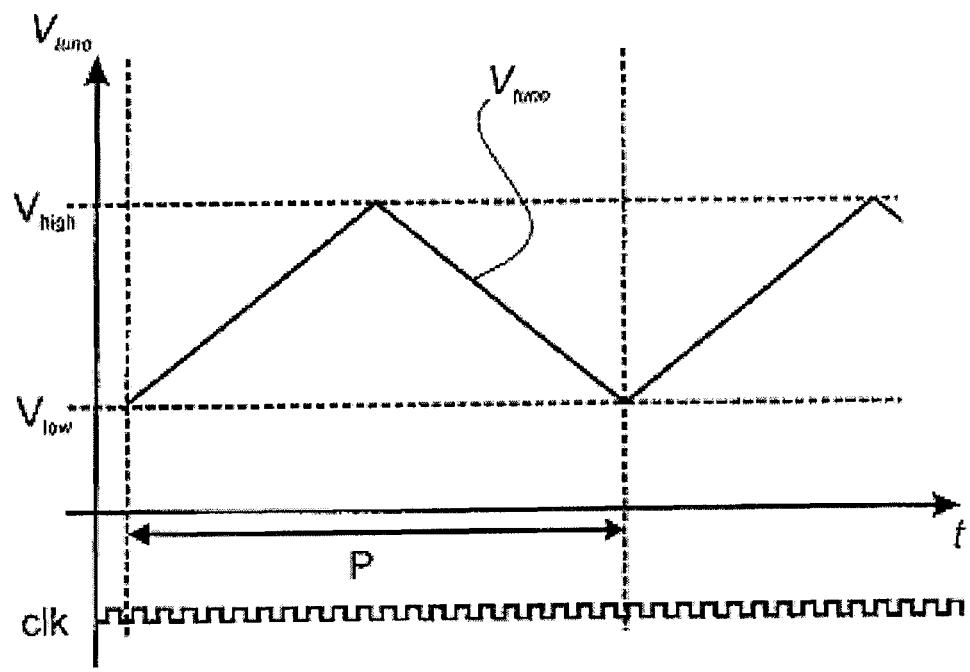
FIG. 2 is a graph showing a generated tuning voltage oscillation.

This will cause an oscillation illustrated in FIG. 2 with a frequency or oscillation period "P" dependent on the loop bandwidth of the PLL. By counting the number of reference clock cycles clk during one oscillation period "P," the bandwidth can be estimated by comparing the number of reference clock cycles to a reference number.

The generation of the oscillation is initiated "A" by offsetting the divider value such that the PLL forces the tuning voltage towards either one of the high or low threshold voltage, and in the example shown with reference to FIG. 1 this is initiated by offsetting the divider value such that the PLL forces the tuning voltage towards the low threshold voltage. It should be understood that it is also possible to start by offsetting the divider value such that the PLL forces the tuning voltage towards the high threshold voltage, and the skilled person understand that if this is the case, the starting comparison "C" must be to see if the tuning voltage equals the high threshold value and the later comparison "J" must be to see if the tuning voltage equals the low threshold value.

Figure 3:
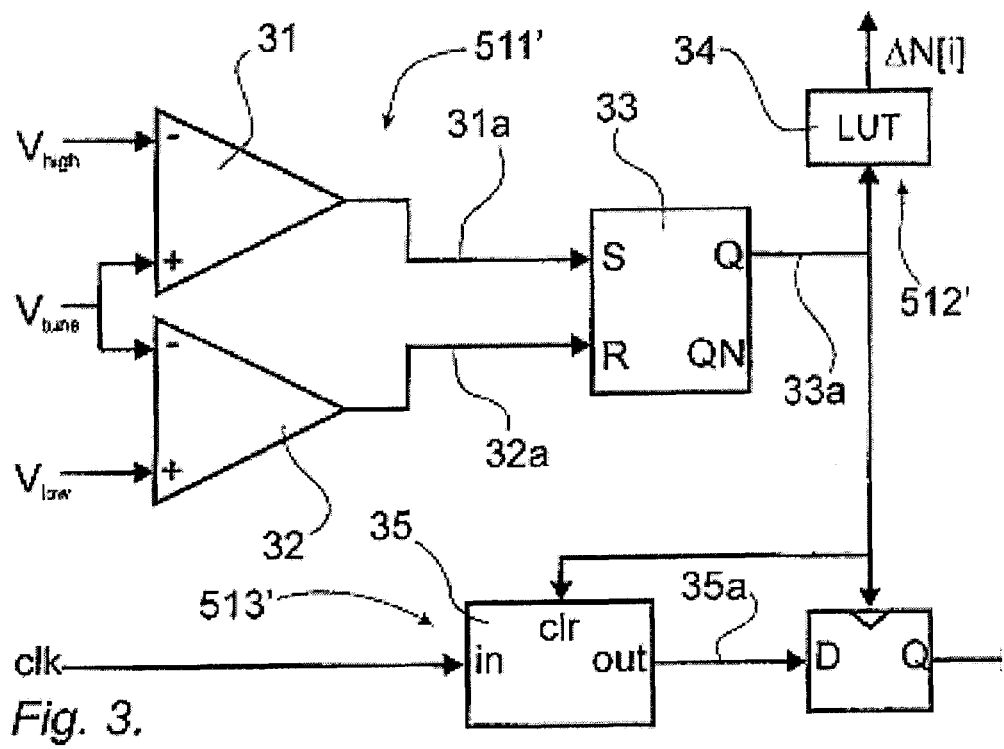
FIG. 3 is a schematic and simplified first embodiment of how to generate a tuning voltage oscillation.

The comparison between the tuning voltage and the high and low threshold voltages, and the generation of a signal corresponding to the oscillation of the tuning voltage, can be implemented in different ways. FIG. 3 shows an embodiment where this is done by:

comparing the tuning voltage Vtune with the high threshold voltage Vhigh in a first comparator 31, comparing the tuning voltage Vtune with the low threshold voltage Vlow in a second comparator 32, feeding the output 31a, 32a of the first and second comparator 31, 32 to a Set/Reset flip-flop (SRFF) 33, and toggle the output 33a of the SRFF when either of the high or low threshold voltage is reached, thus generating an output oscillating signal corresponding to the oscillation of the VCO tuning voltage from the output of the SRFF 33a.

Figure 4:
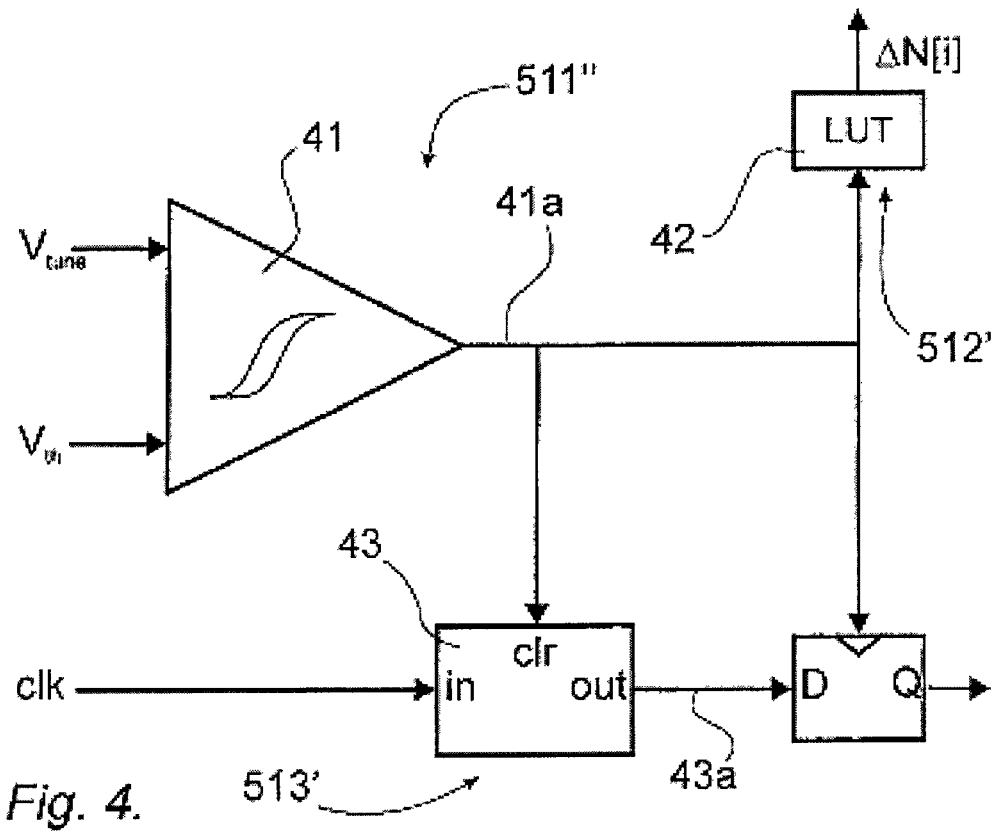
FIG. 4 is a schematic and simplified second embodiment of how to generate a tuning voltage oscillation.

Another example embodiment of FIG. 4 compares the tuning voltage $V_{tune}$ with a predefined threshold voltage $V_{th}$ in a comparator with hysteresis 41, where the hysteresis is chosen such that the low-to-high and high-to-low threshold voltages of the comparator with hysteresis 41 equal the high and low threshold voltages, thus generating an output oscillating signal 41a corresponding to the oscillation of the VCO tuning voltage from the output of the comparator with hysteresis 41.

Regardless of how the output oscillating signal is generated, the output oscillating signal is preferably used to drive a look-up table (LUT) 34, 42, and that the divider offset value ΔN[i] is determined from the LUT 34, 42.

The present invention teaches that the reference clock cycles clk can be counted with a pulse counter 35, 43, that the output 35a, 43a of the pulse counter 35, 43 can be stored and that, at the same time, the pulse counter 35, 43 can be reset after each full oscillation cycle "P" of the tuning voltage $V_{tune}$. The counting of the reference clock cycles is indicated as step "H", and the storage of the output and the resetting of the pulse counter 35, 43 is indicated as step "E" in FIG. 1.

The high and low threshold voltages $V_{high}$, $V_{low}$, are preferably chosen so that the amplitude of the tuning voltage oscillation is as high as possible within the linear working range of the PLL.

In order to increase the accuracy of the measurement, the number of reference clock cycles may be counted over a multiple of VCO tuning voltage oscillation cycles, and the number of so counted reference clock cycles averaged over the multiple of VCO tuning voltage oscillation cycles, as shown in FIG. 1, where a counter is used to count the number of tuning voltage oscillation cycles "B", "D" so that when a preset number of tuning voltage oscillation cycles have been reached the generation of the oscillation can be ended "F" and the comparison can be made "G".

The inventive method can, e.g., be used in connection with a PLL using polar modulation architecture.

Figure 5:
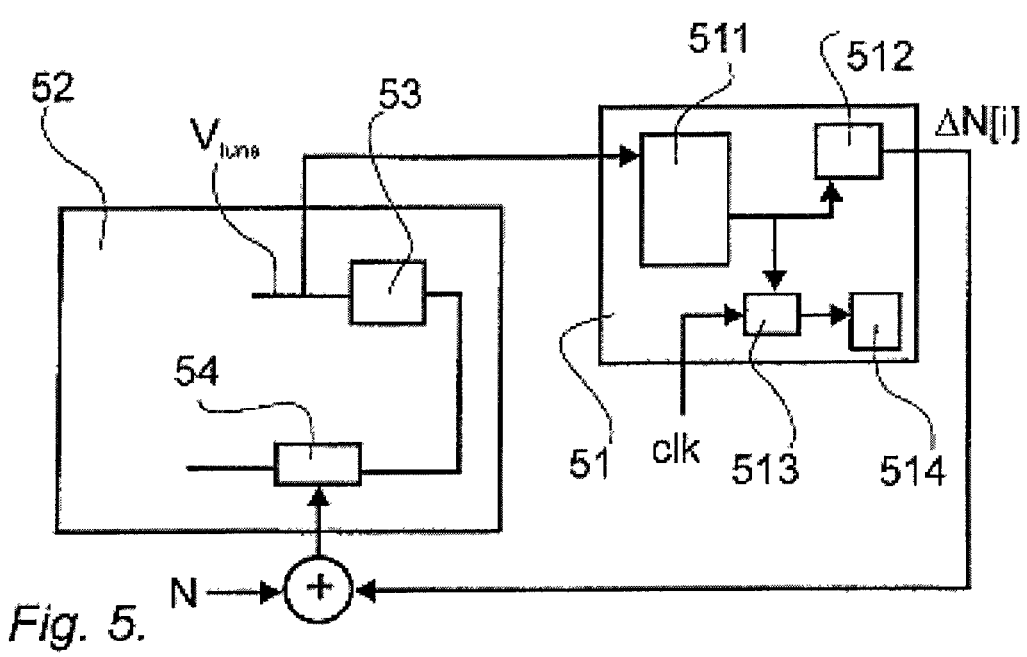
FIG. 5 is a schematic and simplified illustration of an inventive device.

With reference to FIG. 5 an inventive device 51 for measuring the closed loop bandwidth characteristics of a Phase Locked Loop (PLL) 52 will now be described, which PLL 52 comprises a voltage controlled oscillator (VCO) 53 controlled by means of a tuning voltage $V_{tune}$. A divider 54 could for instance be a multi-modulus divider (MMD) known as such in the art.

The device 51 comprises a comparing unit 511 adapted to compare the VCO tuning voltage $V_{tune}$ to one low and one high threshold voltage $V_{low}$, $V_{high}$. The device 51 also comprises a generating unit 512 adapted to generate a constant ΔN[i] that is added to the divider 54 command word N of the PLL 52 when the low threshold voltage $V_{low}$, is reached, thus offsetting the divider value such that the PLL forces the tuning voltage $V_{tune}$ towards the high threshold voltage $V_{high}$. The generating unit 512 is also adapted to generate a constant ΔN[i] that is subtracted from the divider 54 command word N of the PLL 52 when the high threshold voltage $V_{high}$ is reached, thus offsetting the divider value such that the PLL 52 forces the tuning voltage $V_{tune}$ towards the low threshold voltage $V_{low}$. In this way the device 51 is adapted to generate an oscillation of the VCO tuning voltage $V_{tune}$ as shown in FIG. 2.

The device 51 comprises a measuring unit 513, which is adapted to measure the period "P" of the oscillation between the high and the low threshold voltage $V_{high}$, $V_{low}$ of the VCO tuning voltage by counting the number of cycles of a reference clock signal clk.

The device also comprises a determining unit 514, which is adapted to compare the number of reference clock cycles to a predetermined reference number of clock cycles, thereby determining the relative loop bandwidth of the PLL 52.

According to one example embodiment, schematically illustrated in FIG. 3, it is taught that the comparing unit 511' comprises a first comparator 31, adapted to compare the tuning voltage $V_{tune}$ with the high threshold voltage $V_{high}$, and a second comparator 32, adapted to compare the tuning voltage $V_{tune}$ with the low threshold voltage $V_{low}$. This comparing unit 511' comprises a Set/Reset flip-flop (SRFF) 33, adapted to receive the output 31a, 32a of the first and second comparator 31, 32, and the output of the SRFF 33a is adapted to be toggled when either of the high or low threshold voltage is reached, thus the comparing unit 511' is adapted to generate an output oscillating signal 33a corresponding to the oscillation of the VCO tuning voltage $V_{tune}$ from the output of the SRFF 33.

According to another example embodiment, illustrated in FIG. 4, it is taught that the comparing unit 511" comprises a comparator 41 with hysteresis adapted to compare the tuning voltage $V_{tune}$ with a predefined threshold voltage $V_{th}$, where the hysteresis is chosen such that the low-to-high and high-to-low threshold voltages equal the high and low threshold voltages $V_{high}$, $V_{low}$, thus the comparing unit 511" is adapted to generate an output oscillating signal 41a corresponding to the oscillation of the VCO tuning voltage from the output of the comparator with hysteresis 41.

Regardless of how the oscillating output signal is generated, the generating unit 512' preferably comprises a look-up table (LUT) 34, 42, that the comparing unit 511', 511" is adapted to drive the LUT 34, 42 by means of the output oscillating signal 33a, 41a, and that the generating unit 512' is adapted to generate the constant ΔN[i] through the LUT.

In an example embodiment of the invention the measuring unit 513' comprises a pulse counter 35, 42 adapted to count the reference clock cycles clk, the measuring unit 513' preferably also being adapted to store the output 35a, 42a of the pulse counter 35, 42 and, at the same time, reset the pulse counter 35, 42 after each full oscillation cycle of the tuning voltage $V_{tune}$.

The high and low threshold voltages $V_{high}$, $V_{low}$ are favourably chosen so that the amplitude of the tuning voltage oscillation is as high as possible within the linear working range of the PLL 52.

Also favourably, the measuring unit 513, 513' is adapted to count the number of reference clock cycles over a multiple of VCO tuning voltage oscillation cycles, and provide an average of the number of reference clock cycles over the multiple of VCO tuning voltage oscillation cycles.

In an embodiment of the invention, PLL 52 is arranged according to a polar modulation architecture.

The present invention teaches that the device 51 is an on chip device. The device 51 can even be an on chip device together with the PLL 52.

In brief, example features and properties are summarized as follows

1. A method of determining closed loop bandwidth characteristic of a Phase Locked Loop (PLL) comprising a voltage controlled oscillator (VCO) controlled by means of a tuning voltage, characterised by:
   comparing the VCO tuning voltage to a low threshold voltage and a high threshold voltage,
   creating an oscillation of the VCO tuning voltage by
   offsetting a divider value such that the PLL forces the tuning voltage towards the high threshold voltage when the low threshold voltage is reached, and
   offsetting the divider value such that the PLL forces the tuning voltage towards the low threshold voltage when the high threshold voltage is reached,
   measuring the period of the oscillation between the high and the low threshold voltage of the VCO tuning voltage by counting the number of cycles of a reference clock signal, and comparing the number of reference clock cycles to a predetermined reference number of clock cycles.

2. A method according to feature 1, characterised by:
   comparing the tuning voltage with the high threshold voltage in a first comparator,
   comparing the tuning voltage with the low threshold voltage in a second comparator,
   feeding the output of the first and second comparator to a Set/Reset flip-flop (SRFF), and toggle the output of the SRFF when either of the high or low threshold voltage is reached, thus generating an output oscillating signal corresponding to the oscillation of the VCO tuning voltage from the output of the SRFF.

3. A method according to feature 1, characterised by
   comparing the tuning voltage with a predefined threshold voltage in a comparator with hysteresis, where the hysteresis is chosen such that the low-to-high and high-to-low threshold voltages equal the high and low threshold voltages, thus generating an output oscillating signal corresponding to the oscillation of the VCO tuning voltage from the output of the comparator with hysteresis.

A method according to feature 2 or 3, characterised by:
   accessing a look-up table (LUT) representation based upon the output oscillating signal as input, and
   determining the divider offset value from the LUT.

5. A method according to feature 4, characterised by:
   counting the reference clock cycles with a pulse counter,
   storing the output of the pulse counter and at the same time resetting the pulse counter after each full oscillation cycle of the tuning voltage.

6. A method according to any preceding feature, characterised by setting the high and low threshold voltages in relation to the linear working range of the PLL, thereby e.g. maximizing the amplitude of the tuning voltage oscillation.

7. A method according to any preceding feature, characterised by:
   counting the number of reference clock cycles over multiple of VCO tuning voltage oscillation cycles, and averaging the number of reference clock cycles.

8. A method according to any preceding feature, characterised in, that the method is used in connection with a PLL using a polar modulation architecture.

9. A device of determining closed loop bandwidth characteristic of a Phase Locked Loop (PLL), which PLL comprises a voltage controlled oscillator (VCO) controlled by means of a tuning voltage, characterised by
   comparing unit adapted to compare the VCO tuning voltage to one low and one high threshold voltage,
   a generating unit adapted to generate a constant that is added to a divider command word of the PLL when the low threshold voltage is reached and a constant that is subtracted from the divider command word of the PLL when the high threshold voltage is reached,
   a measuring unit, which is adapted to measure the period of the oscillation between the high and the low threshold voltage of the VCO tuning voltage by counting the number of cycles of a reference clock signal, and
   a determining unit, which is adapted to compare the number of reference clock cycles to a predetermined reference number of clock cycles.

10. The device according to feature 9, comprising
    a divider provided with a command word signalling input and being arranged to offset the divider value for the PLL to force the tuning voltage towards the high threshold voltage or the low threshold voltage conditionally upon the command word signalling.

11. A device according to feature 9, characterised in that the comparing unit comprises:
    a first comparator, adapted to compare the tuning voltage with the high threshold voltage, and
    a second comparator, adapted to compare the tuning voltage with the low threshold voltage, and
    a Set/Reset flip-flop (SRFF), adapted to receive the output of the first and second comparator, and to toggle its output when either of the high or low threshold voltage is reached,
    wherein the comparing unit is thus adapted to generate an output oscillating signal corresponding to the oscillation of the VCO tuning voltage from the output of the SRFF.

12. A device according to feature 9, characterised in, that the comparing unit comprises: a comparator with hysteresis adapted to compare the tuning voltage with a predefined threshold voltage; preferably where the hysteresis threshold voltage corresponds to low-to-high and high-to-low threshold voltages equal to the high and low threshold voltages, the comparing unit being adapted to generate an output oscillating signal, corresponding to oscillation of the VCO tuning voltage, from the output of the comparator with hysteresis.

13. A device according to feature 11 or 12, characterised by
    the generating unit comprising look-up table (LUT) circuitry to store offset values of various tuning voltage directions or slopes,
    the comparing unit comprising a binary output connection to provide a binary signal by means of the output oscillating signal, and
    the generating unit comprising processing means adapted to generate the constant based upon the LUT circuitry storage in response to the output oscillating signal.

A device according to feature 9, characterised by
    the measuring unit comprising a pulse counter adapted to count the reference clock cycles, and the measuring unit comprising memory and processing means arranged to store the output of the pulse counter and at the same time reset the pulse counter after each full oscillation cycle of the tuning voltage.

15. A device according to any one of features 9 to 14, characterised by one or more high and low threshold voltages setting means.

16. A device according to any one of features 9 to 15, characterised in, that the measuring unit is adapted to count the number of reference clock cycles over a multiple of VCO tuning voltage oscillation cycles, and average the number of reference clock cycles.

17. A device according to any one of features 9 to 16, characterised by the PLL being arranged according to a polar modulation architecture.

18. A device according to any one of features 9 to 16, characterised in, that the device is an on chip device.

19. A system of determining a closed loop bandwidth characteristic characterised by a device of determining a closed loop bandwidth characteristic according to any of features 9-18 and a phase locked loop, PLL, comprising a voltage controlled oscillator (VCO), the device and the PLL being arranged on a single chip.

It will be understood that the invention is not restricted to the aforedescribed and illustrated exemplifying embodiments thereof and that modifications can be made within the scope of the inventive concept as illustrated in the accompanying Claims.

What is claimed is:

1. A method of determining closed loop bandwidth characteristic of a Phase Locked Loop (PLL) comprising a voltage controlled oscillator (VCO) controlled by means of a tuning voltage, comprising the steps:
    comparing the tuning voltage to a low threshold voltage and a high threshold voltage respectively,
    creating an oscillation of the tuning voltage by:
        offsetting a divider value such that the PLL forces the tuning voltage towards the high threshold voltage when the low threshold voltage is reached, and
        offsetting the divider value such that the PLL forces the tuning voltage towards the low threshold voltage when the high threshold voltage is reached;
    measuring the period of the oscillation between the high and the low threshold voltage of the tuning voltage by counting the number of cycles of a reference clock signal, and
    comparing the number of reference clock cycles to a predetermined reference number of clock cycles.

2. The method according to claim 1, comprising the steps:
    comparing the tuning voltage with the high threshold voltage in a first comparator,
    comparing the tuning voltage with the low threshold voltage in a second comparator,
    feeding an output of the first comparator and an output of the second comparator to a Set/Reset flip-flop (SRFF), and toggle an output of the SRFF when either of the high or low threshold voltage is reached, thus generating an output oscillating signal corresponding to the oscillation of the tuning voltage from the output of the SRFF.

3. The method according to claim 1, comprising the steps:
    comparing the tuning voltage with a predefined threshold voltage in a comparator with hysteresis, where the hysteresis is chosen such that the low-to-high and high-to-low threshold voltages equal to the high and low threshold voltages respectively, thus generating an output oscillating signal corresponding to the oscillation of the tuning voltage from the output of the comparator with hysteresis.

4. The method according to claim 2, comprising the steps:
    accessing a look-up table (LUT) representation based upon the output oscillating signal as input, and
    determining the divider offset value from the LUT.

5. The method according to claim 3, comprising the steps:
    accessing a look-up table (LUT) representation based upon the output oscillating signal as input, and
    determining the divider offset value from the LUT.

6. The method according to claim 5, comprising the steps:
    counting the reference clock cycles with a pulse counter,
    storing the output of the pulse counter at the same time, and
    resetting the pulse counter after each full oscillation cycle of the tuning voltage.

7. The method according to claim 6, comprising the steps:
    counting the number of reference clock cycles over multiple of VCO tuning voltage oscillation cycles, and
    averaging the number of reference clock cycles.

8. The method according to claim 7, characterised in that the method is used in connection with a PLL using a polar modulation architecture.

9. A device of determining closed loop bandwidth characteristic of a Phase Locked Loop (PLL), which PLL comprises a voltage controlled oscillator (VCO) controlled by means of a tuning voltage, comprising the steps:
    a comparing unit adapted to compare the tuning voltage to one low and one high threshold voltage respectively,
    a generating unit adapted to generate a constant that is added to a divider command word of the PLL when the low threshold voltage is reached and a constant that is subtracted from the divider command word of the PLL when the high threshold voltage is reached,
    a measuring unit, which is adapted to measure the period of the oscillation between the high and the low threshold voltage of the tuning voltage by counting the number of cycles of a reference clock signal, and
    a determining unit, which is adapted to compare the number of reference clock cycles to a predetermined reference number of clock cycles.

10. The device according to claim 9, comprising:
    a divider provided with a command word signalling input and being arranged to offset the divider value for the PLL to force the tuning voltage towards the high threshold voltage or the low threshold voltage upon the command word signalling.

11. The device according to claim 9, characterised in that the comparing unit comprises:
    a first comparator, adapted to compare the tuning voltage with the high threshold voltage, and
    a second comparator, adapted to compare the tuning voltage with the low threshold voltage, and
    a Set/Reset flip-flop (SRFF), adapted to receive an output of the first comparator and an output of the second comparator, and to toggle an output when either of the high or low threshold voltage is reached,
    wherein the comparing unit is thus adapted to generate an output oscillating signal corresponding to the oscillation of the tuning voltage from the output of the SRFF.

12. The device according to claim 9, characterised in, that the comparing unit comprises:
    a comparator with hysteresis adapted to compare the tuning voltage with a predefined threshold voltage; wherein the hysteresis threshold voltage corresponds to low-to-high and high-to-low threshold voltages equal to the high and low threshold voltages respectively, the comparing unit being adapted to generate an output oscillating signal, corresponding to oscillation of the tuning voltage, from the output of the comparator with hysteresis.

13. The device according to claim 9, characterised by the measuring unit comprising a pulse counter adapted to count the reference clock cycles, and the measuring unit comprising memory and processing means arranged to store an output of the pulse counter at the same time, and reset the pulse counter after each full oscillation cycle of the tuning voltage.

14. A system of determining a closed loop bandwidth characteristic characterised by a device of determining a closed loop bandwidth characteristic according to claim 9 and a phase locked loop (PLL), comprising a voltage controlled oscillator (VCO), the device and the PLL being arranged on a single chip.

* * * * *